United States Patent
Werker et al.

(10) Patent No.: US 10,605,833 B2
(45) Date of Patent: Mar. 31, 2020

(54) E-PIN ATTACHED CURRENT MEASUREMENT COIL

(71) Applicant: Hanon Systems, Daejeon (KR)

(72) Inventors: Stephan Werker, Merzenich-Golzheim (DE); Wilfried Pfahl, Elsdorf (DE); Mario Lenz, Kerpen (DE)

(73) Assignee: HANON SYSTEMS, Daejeon (KR)

( * ) Notice: Subject to any disclaimer, the term of this patent is extended or adjusted under 35 U.S.C. 154(b) by 320 days.

(21) Appl. No.: 15/649,898

(22) Filed: Jul. 14, 2017

(65) Prior Publication Data

US 2018/0017600 A1    Jan. 18, 2018

(30) Foreign Application Priority Data

Jul. 15, 2016 (DE) .................. 10 2016 113 055

(51) Int. Cl.
| | |
|---|---|
| *G01R 19/00* | (2006.01) |
| *G01R 15/18* | (2006.01) |
| *G01R 15/20* | (2006.01) |
| *H01F 17/04* | (2006.01) |
| *H01F 38/30* | (2006.01) |

(52) U.S. Cl.
CPC .......... *G01R 15/181* (2013.01); *G01R 15/20* (2013.01); *H01F 17/045* (2013.01); *H01F 38/30* (2013.01); *H01F 2038/305* (2013.01)

(58) Field of Classification Search
CPC ..................................................... G01R 19/00
See application file for complete search history.

(56) References Cited

U.S. PATENT DOCUMENTS

| | | | |
|---|---|---|---|
| 2005/0196285 A1 | 9/2005 | Jayanth | |
| 2014/0171935 A1* | 6/2014 | Digmann | ........... A61B 18/1206 606/34 |

FOREIGN PATENT DOCUMENTS

| | | |
|---|---|---|
| EP | 2287876 A1 | 2/2011 |
| JP | 4622839 B2 | 2/2011 |
| JP | 2013148037 A | 8/2013 |

\* cited by examiner

*Primary Examiner* — Jacob B Marks

(57) ABSTRACT

The invention, which relates to an arrangement for current measurement at a current lead-through, addresses the problem of specifying an arrangement for current measurement by means of which a reliable, galvanically isolated measurement of motor phase currents can be carried out, wherein the space requirement of the arrangement is reduced. This problem is resolved thereby that the sensor is a measuring coil and that the measuring coil is disposed on the lead-through contact such that it is galvanically isolated from the same.

20 Claims, 6 Drawing Sheets

E-PIN ATTACHED CURRENT MEASUREMENT COIL

Figure 1:
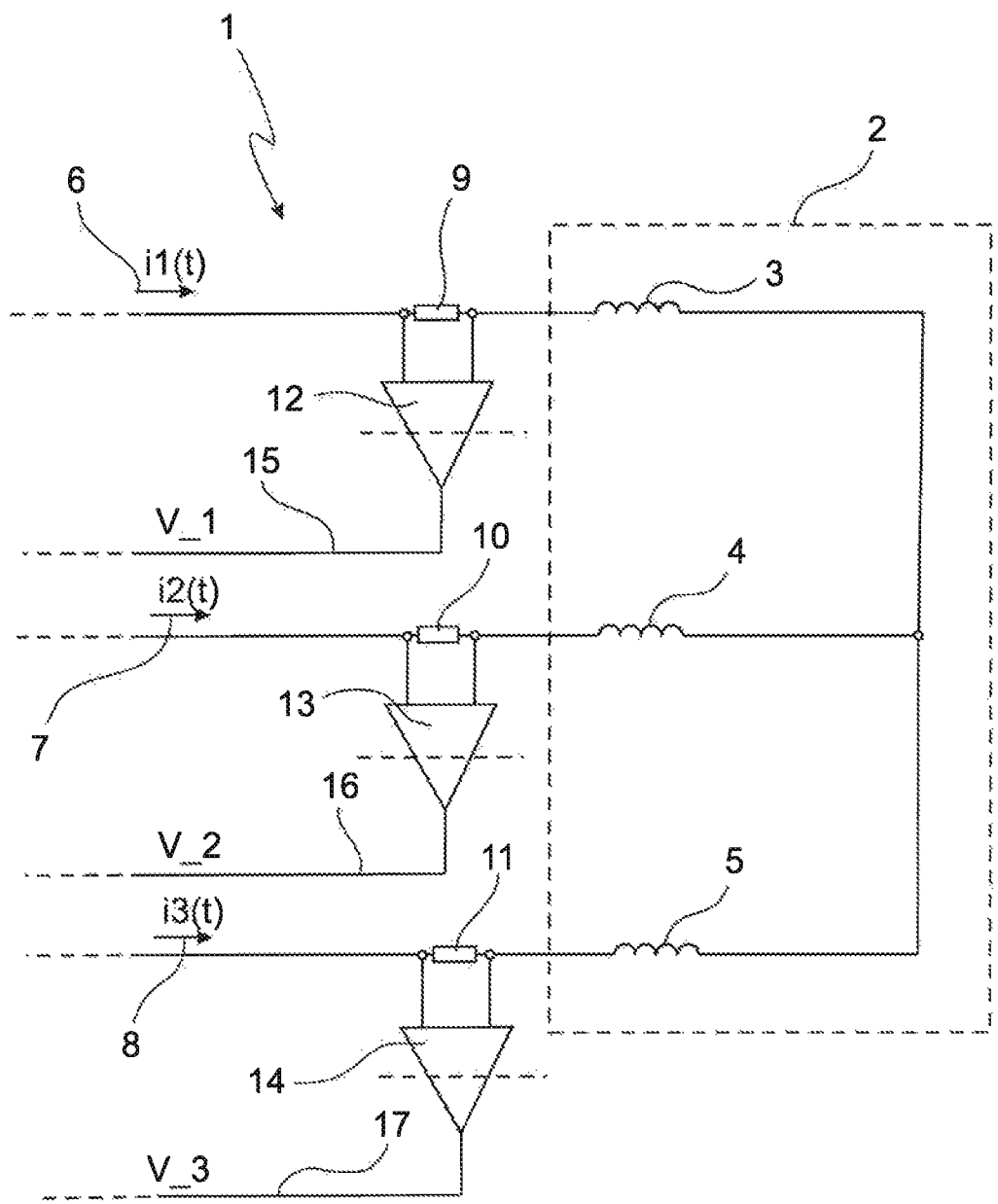

This application claims priority from German Patent Application No. 10 2016 113 055.9 filed on Jul. 15, 2016, incorporated herein by reference in its entirety for all purposes.

The invention relates to an arrangement for current measurement at a current lead-through, comprising a planar board in which at least one lead-through contact is disposed, wherein between the planar board and the lead-through contact an electrically insulating casting compound is disposed, and an amplifier configuration for the amplification of a current measurement signal.

The invention relates in particular to current measurement at pressure-resistant lead-through contacts which are referred to as e-pins, wherein the arrangement for current measurement must include galvanic isolation. Such current measurements are necessary, for example on electric refrigerant compressors in which pressure-resistant lead-through contacts for the current supply of the drive motor are utilized.

Such electric drive motors are driven by an electric alternating-current converter, also referred to as inverter, which determines the speed and the torque of the drive motor by regulation of the motor phase currents. For the regulation of the speed and/or the torque of the drive motor information inter alia regarding the individual motor phase currents is required.

It is known to measure a motor phase current i by means of a precision shunt resistor inserted in the supply line of the motor phase to be measured as well as a differential amplifier connected to the precision shunt resistor.

In the measurement of such motor phase currents, in particular with so-called high-volt inverters, which provide an AC output voltage in the range above 25 V, care must be taken that the measurement is carried out allowing for the galvanic isolation between the input and the output of the measuring arrangement. Such galvanic isolation, or isolated measurement, according to prior art is accomplished, for example, using special isolated differential amplifiers or Hall effect sensor circuits.

It is moreover necessary to provide on the circuit board appropriate installation space for the components that are necessarily of large size due to the isolation spacing that must be maintained.

In the event the motor to be energized by the inverter or power converter is disposed in a housing that is under pressure, such as is the case, for example, in an electric refrigerant compressor in which the drive motor is disposed in an end housing that is surrounded by a coolant, the power supply of this drive motor must be realized using so-called pressure-resistant lead-through contacts (e-pins). According to prior art such lead-through contacts must be implemented of copper coated pins. These lead-through contacts are each fixed by means of a glass or synthetic casting compound in an opening of a planar board (e-pin board) and are consequently secured in the planar board such that they are electrically insulated.

The planar board itself includes a pressure-resistant fit or a sealing and is, for example, screwed or clamped against the end housing of the refrigerant compressor.

One disadvantage of the described prior art is that the differential amplifiers or Hall effect sensor circuits of the arrangement for current measurements, in particular when utilizing a high-volt inverter, must include internal isolation. In an alternative embodiment a further component or integrated chip (IC) must be utilized to provide the isolation, for example in the form of an optocoupler. These measures increase the technical circuitry expenditures and thereby raise the costs of the required electronics on the board and increase the space requirement.

A further disadvantage consists therein that through the increased expenditures the measuring dynamics decreases. In addition, a rise in the time delay in the current measurement must be tolerated which has a negative effect on the precise regulation of a drive motor since greater dead times in the regulation algorithm of the inverter occur. Due to the requirement for galvanic isolation, special isolated voltages must potentially be provided by means of a special voltage supply for the galvanically isolated measurement circuit. This entails further technical circuitry expenditures since, for example, an isolated DC voltage converter must be built and integrated into the circuitry.

If higher currents, for example in a range greater than 10 A, must be measured, the utilized precision shunt resistors and Hall sensors must be dimensioned at appropriate scale which leads to an increase of the space requirements in the board layout.

The manufacturing process of the e-pin boards makes minimum requirements of the length of the e-pins since they must be secured by support mounts in the manufacturing process. This minimum length of the e-pins increases the installation space of the inverter since hereby a minimum distance is created between e-pin board and inverter board that remains unused in the prior art.

JP 2013-148037 discloses a compressor provided for the compression of a refrigerant. For this compressor is disclosed a connector with connection terminals and a connector housing via which the current supply to the compressor is ensured across several contacts. The particular advantage of this connector lies therein that the electrical insulation properties of the connectors are adequately ensured even if the contacts become contaminated by penetrating oil or refrigerant.

A further arrangement for the current lead-through for an electric drive motor is disclosed in EP 2 287 876 A1. This current lead-through comprises several current contacts disposed such that they are insulated, wherein it is provided that a thermal overload protection is integrated in the current lead-through.

These solutions do not include any arrangements for current measurement at a current lead-through and, with the appropriate expansion of the arrangement, consequently entail the above discussed disadvantages.

The invention therefore addresses the problem of specifying an arrangement for current measurement by means of which a reliable, galvanically isolated measurement of motor phase currents can be carried out, wherein the installation requirement is at least decreased on the inverter board or circuit board of the arrangement.

With respect to the entire inverter arrangement the current measurement or the means required therefor will be moved through the invention to a previously spatially nonutilized site.

The problem is resolved through a subject matter with the features according to patent claim 1 of the independent patent claims. Further developments are indicated in the dependent patent claims 2 to 8.

The present invention provides disposing a measuring coil as a sensor for the current measurement on a lead-through contact in the planar board. If the planar board has several lead-through contacts, one measuring coil is disposed on each of the lead-through contacts. Herein, for example, a cylindrically wound coil of one or several turns is employed as the measuring coil. This measuring coil is slid on the inverter side of a pressure houses, for example, of a refrigerant compressor onto each one of the lead-through contacts and each is connected with the associated analysis electronics on an inverter board. In this way the time varying currents to the drive motor flowing through the lead-through contacts can be reliably measured.

In this way, on one hand, the installation space which is generated due to a prescribed minimum spacing between the planar board and an inverter board can, according to the invention, be utilized advantageously. On the other hand the sensor measuring coil, applied electrically insulated on the lead-through contact, already ensures the galvanic isolation in the current measurement whereby the components for the galvanic isolation necessary in prior art become superfluous.

It is provided for the measuring coil to comprise at least one, preferably several windings comprised of a conductive wire material such as copper or aluminum. These wire windings can be slid over the lead-through contact and be secured, for example, by means of a nonconducting adhesive or casting compound.

The wire windings are wound onto a coil former in a preferred embodiment. This coil former, comprised of a nonconductive material, has an opening whose inner diameter is selected such that the coil former can be slid over a lead-through contact.

To fix the coil former on the lead-through contact an adhesive or a casting compound can be introduced between the coil former and the lead-through contact.

The material for the coil former can be, for example, a synthetic material or a Teflon material as well as other nonconducting materials.

It is provided for the planar board, which can be, for example, rectangular, circular, triangular or kidney-shaped, to be provided with an indentation extending in the margin region about the planar board. Into this indentation a sealing can be placed corresponding to the shape of the indentation and the planar board can subsequently be screwed together with a housing of a refrigerant compressor. In this way a current lead-through, for example for a drive motor of a refrigerant compressor, is provided with one or several lead-through contacts and the compressor housing is sealed tight.

As an alternative to the above described sealing on the planar board, a tight fit can also be selected in order to secure the planar board tightly on the housing of the refrigerant compressor. In the current supply of a multiphase drive motor several planar boards with one lead-through contact each can be utilized or one planar board with several lead-through contacts.

If, for example, two or three lead-through contacts are employed for a three-phase drive motor, it is advantageous to dispose on each lead-through contact one measuring coil for current measurement. Each of these is coupled with an associated differential amplifier at the input side and in this way for each phase one current measuring signal is provided through the arrangement for current measurement at a current lead-through. As is conventional, these provided signals are utilized by an electronic circuitry driving the drive motor in order to control, for example, the speed or the torque of the drive motor.

An advantageous embodiment provides disposing one circuit board which, for the current supply of the drive motor, is connected to the lead-through contacts. On this circuit board the differential amplifiers are disposed which are required for the amplification of the measurement signals provided by the sensor and their inputs are connected to one measuring coil each. For the output of the output signals generated by the current measurement arrangement, the circuit board also comprises outputs which are in each instance connected to an output of the differential amplifier.

This circuit board can also accept the component parts of an inverter driving the drive motor.

In a particular embodiment there is the feasibility of disposing one measuring coil on only two of the three lead-through contacts on a three-phase drive motor and to carry out only two current measurements in order to control the drive motor as required. In this case there is the feasibility, using the values of the two detected phase currents, to determine the third phase current by calculation using an algorithm known in prior art. In this way the technical circuitry expenditures can be reduced at least for the current measurements at the current lead-through.

In a special embodiment of the invention it is provided that at the site of the above described measurement coil, which is secured over the lead-through contact with or without a coil former, an annular magnetic support be disposed that is comprised of a magnetic material with high permeability. The magnetic material should preferably have a permeability $\mu$ of more than 300 $H*m^{-1}$. Utilized are ferrites or ferrite alloys which is have low magnetic losses.

The measuring coil is developed by radially winding several windings around the annular magnetic support by means of a conductive wire material comprised, for example, of copper or aluminum. Due to this winding the wire material extends, at least over one section per winding, parallel to the lead-through contact at a distance per winding.

The generated unit of annular magnetic support and measuring coil includes an opening whose inner diameter is selected such that the unit can be slid over a lead-through contact. This unit is secured on the lead-through contact such that it is electrically insulated from it. To fix this unit on the lead-through contact, an adhesive or a casting compound can be introduced between the lead-through contact and the unit.

By means of this unit low-frequency currents, in particular in the range between approximately 50 Hz and 3 kHz can be measured with high accuracy. Due to the magnetic material employed for the annular magnetic support, a concentration of the magnetic field generated by the current I flowing in the lead-through contact is attained. The magnetic flux in the measuring coil thus increases and the current measurement is improved.

Figure 2:
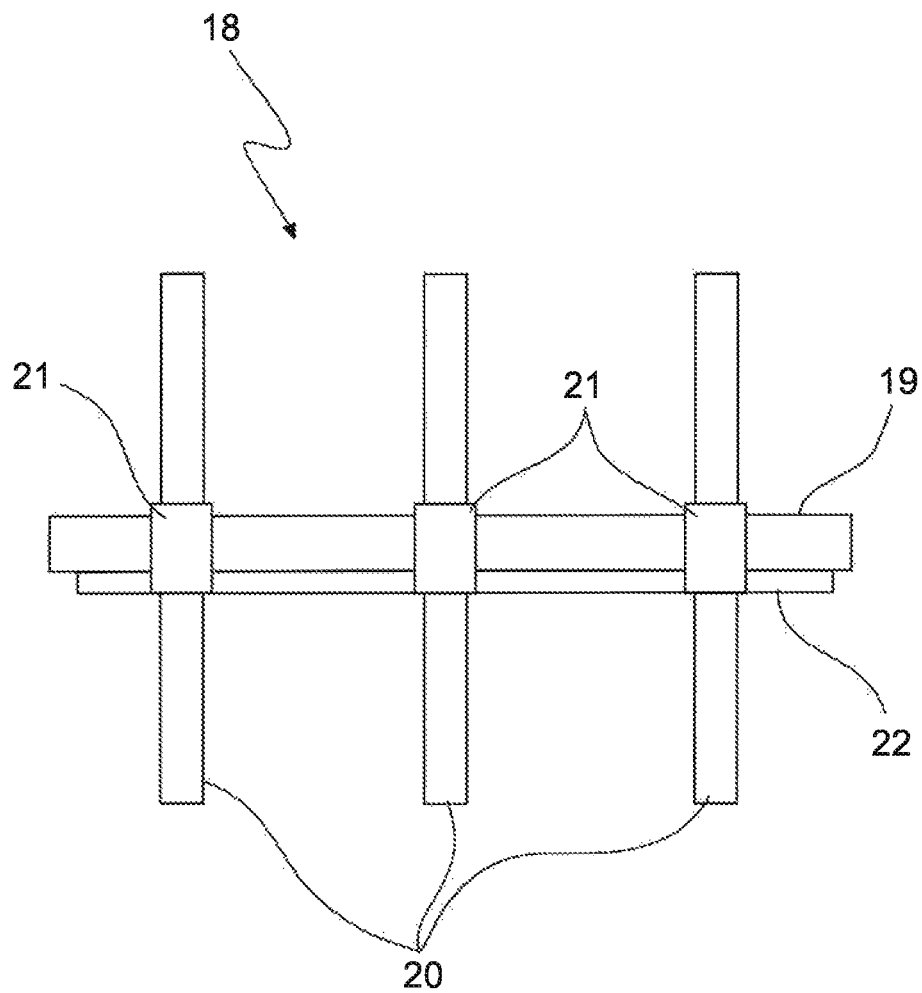
Figure 3:
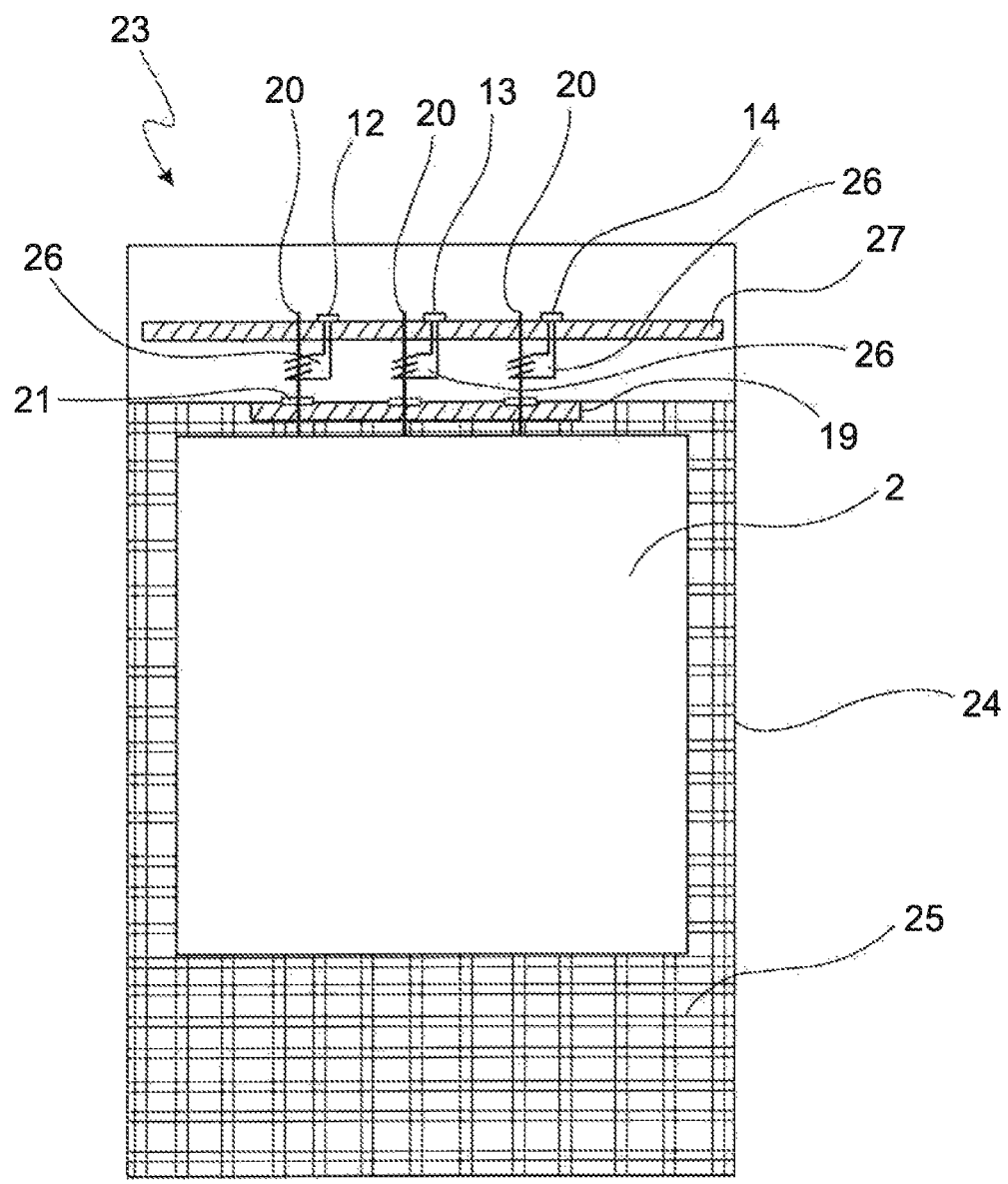
Figure 4:
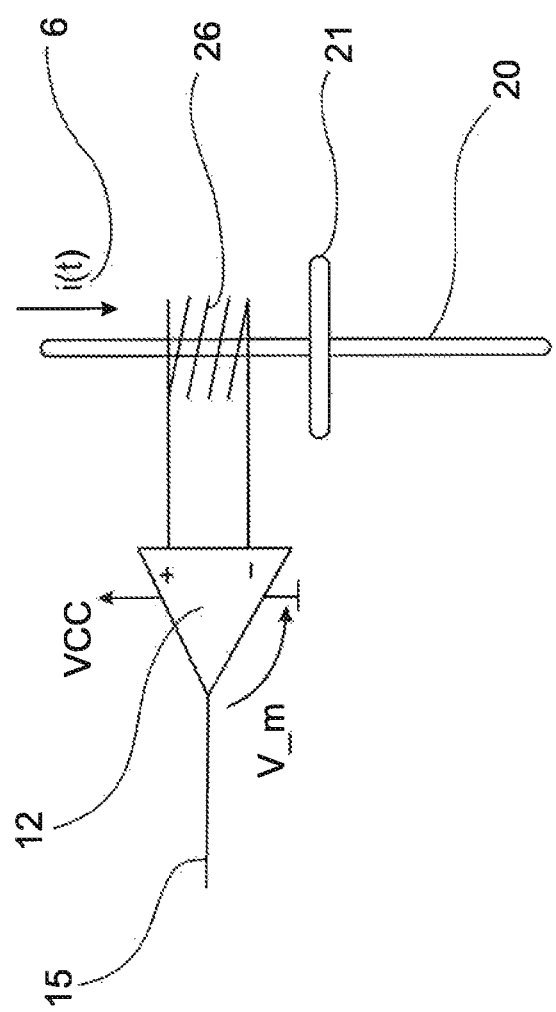
Figure 5:
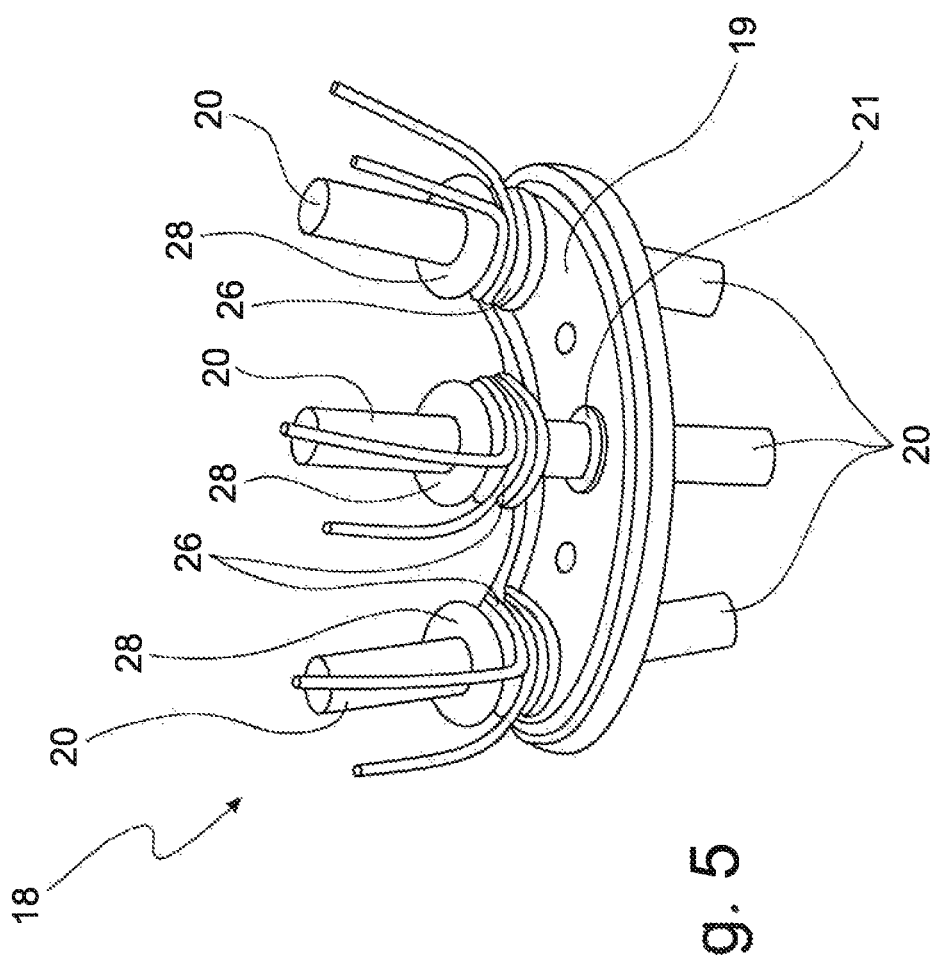
Figure 6:
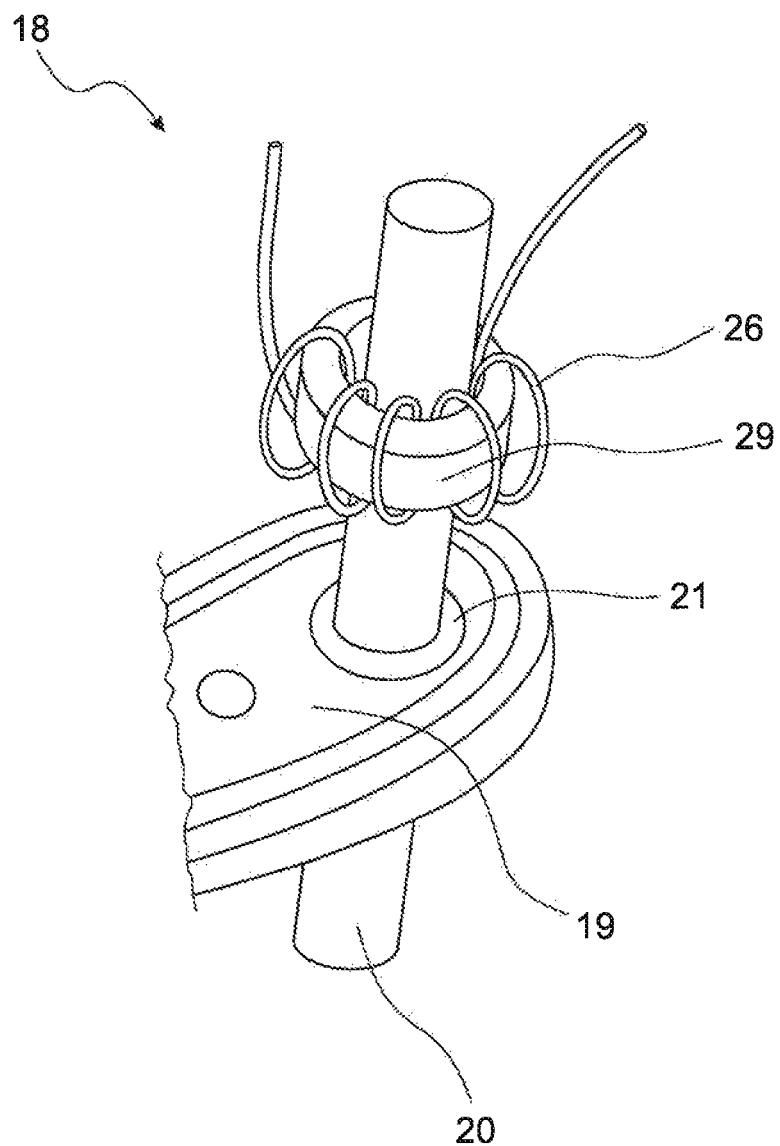

Further details, characteristics and advantages of implementations of the invention are evident based on the following description of embodiment examples with reference to the associated drawing. Therein depict:

FIG. 1: an arrangement for current measurement suitable for use for current measuring at a current lead-through according to prior art, FIG. 2: a sectional representation of an e-pin board according to prior art, FIG. 3: a sectional representation through a refrigerant compressor with an arrangement according to the invention for current measurement at a current lead-through, FIG. 4: a schematic electric diagram of the arrangement for current measurement according to the invention, FIG. 5: a representation of an implementation of an e-pin board with parts of the arrangement for current measurement according to the invention, and FIG. 6: a further embodiment of the e-pin board with parts of the arrangement for current measurement according to the invention.

FIG. 1 shows a known arrangement for current measurement 1 of prior art by means of which a current measurement on a current lead-through 18, not shown in FIG. 1, can be realized.

Depicted is a drive motor 2 having at its disposal three phase windings 3, 4 and 5. To measure the first motor phase current 6 (i1), in the corresponding supply line to the first phase winding 3 is placed a first shunt resistor 9. To measure the second motor phase current 7 (i2), in the supply line to the second phase winding 4 is placed a shunt resistor 10 and for measuring the third motor phase current 8 (i3), a shunt resistor 11 is provided. As is conventional, the voltages dropping across the shunt resistors 9, 10 and 11 are each applied to one input of an associated differential amplifier and converted by it into an output voltage with higher voltage amplitude.

In FIG. 1 the voltage dropping across the first shunt resistor 9 is applied at the input of a first differential amplifier 12 which generates the first output voltage V_1 at the differential amplifier output 15. The magnitude of this output voltage depends on the voltage dropping at shunt resistor 9 and the amplification factor of the differential amplifier 12. The dashed line extending in FIG. 1 through the differential amplifier 12 represents the property of the differential amplifier 12 to realize a galvanic isolation between the input voltage and the generated output voltage. The same applies also to the differential amplifiers 13 and 14.

The voltage dropping across the second shunt resistor 10, furthermore, is applied at the input of a second differential amplifier 13 which generates the second output voltage V_2 at the differential amplifier output 16. The voltage dropping across the third shunt resistor 11 is applied at the input of a third differential amplifier 14 which generates the third output voltage V_3 at the differential amplifier output 17.

The three output voltages V_1, V_2 and V_3 generated by the arrangement for current measurement are supplied to an electric inverter, not shown, which energizes the drive motor 2 or to a central control or regulation unit and is utilized, for example, for regulating the speed or the torque of the drive motor 2.

The current lead-through 18 depicted in FIG. 2 is comprised of a planar board 19 (e-pin board) which most frequently includes one, two or three lead-through contacts 20 (e-pins), wherein the lead-through contacts 20 in the planar board 19 are electrically insulated by means of a casting compound 21 and are tightly sealed. To secure the planar board 19 under sealing on a housing 24 of a refrigerant compressor 23, not depicted in FIG. 2, the planar board 19 is provided with a circumferential seal 22. The planar board 19 can alternatively also be implemented with a pressure-resistant fit. It is provided to screw or clamp the planar boards 19 against an end housing 24 of a refrigerant compressor 23.

FIG. 3 shows a sectional representation of a refrigerant compressor 23 with an arrangement 1 according to the invention for current measurements at a current lead-through 18. In a compressor housing 24 is disposed a drive motor 2, wherein a cooling solution 25 is contained between the housing of the drive motor 2 and the compressor housing 24.

The current lead-through 18 is disposed on the top side of the compressor housing 24 shown in FIG. 3. The planar board 19 comprises three lead-through contacts 20 which are secured therein by means of a casting compound 21. The three depicted lead-through contacts 20 are connected to a circuit board 27. Via this circuit board 27 the current supply to the three lead-through contacts 20 takes place. On this circuit board 27, additionally, further parts or components of the inverter energizing the drive motor 2 can be disposed.

To measure the current, the invention provides applying at each of the lead-through contacts 20 one measuring coil 26 and connecting this measuring coil 26 to an associated differential amplifier 12 or 13 or 14. These measuring coils 26 can be wound, for example, onto a core comprised of a synthetic material, which core is slid over the lead-through contact 20. The associated differential amplifiers 12, 13, 14 are advantageously disposed on the circuit board 27.

When a time-varying current i1(t), i2(t) or i3(t) flows through a lead-through contact 20 from the inverter to the drive motor 2, this current generates a magnetic field about the lead-through contact 20 which also propagates in the measuring coil 26. Through this magnetic field a voltage drop, which is proportional to the current i1(t), i2(t) or i3(t), is induced along the measuring coil 26.

This voltage drop can be tapped at the ends of the coil winding of the measuring coil 26 by a differential amplifier 12, 13 or 14 and its amplitude amplified. At the output of the differential amplifier 12, 13 or 14 results an output voltage or that is proportional to the current and that is further processed by the electronics of the inverter or a central control unit.

It is provided to set the output amplitude of the output voltage that is proportional to the current via the winding number of the measuring coil 26 and the amplification of the differential amplifier 12, 13 or 14.

In FIG. 4 is depicted the schematic electric diagram of the arrangement 1 according to the invention for the current measurement at a current lead-through 18. As an excerpt is depicted a lead-through contact 20 with its insulating casting compound 21. Through the lead-through contact 20 flows the time-varying current i(t) provided by the inverter and generates a magnetic field about the lead-through contact 20.

On the lead-through contact 20 a measuring coil 26 is disposed. This measuring coil 26 is wound, for example, onto a coil former comprised of an insulating material and slid onto the lead-through contact 20. By using an insulating coil former or comparable means, the requirement of a galvanic isolation is already met. Additional technical circuitry measurements, such as the use of particular differential amplifiers or of Hall effect sensor circuits are therefore not necessary.

The generated magnetic field flows through the measuring coil 26 and generates a voltage drop across the measuring coils 26. This voltage is, for example, the input voltage of the differential amplifier 12. This differential amplifier 12 is connected to an operating voltage VCC as well as to ground potential for providing the operating voltage.

Each differential amplifier 12, 13 or 14 generates one output voltage V_m at its differential amplifier outputs 15, 16, or 17 according to the general relationship $$V\_m(t) \sim N*L*di(t)/dt$$

where L is the inductance and N the number of measuring coil turns. The output voltage V_m is thus proportional to the motor phase current 6, 7 or 8.

The output voltages V_1, V_2 and V_3 of differential amplifiers 12, 13 ad 14 are supplied, for example, to a central control which is not depicted in FIG. 4. This central control utilizes the data of the output voltages V_1, V_2, and V_3, for example, for regulating the speed, the torque or the position of a drive motor 2 and for this purpose controls an inverter connected to the drive motor 2.

FIG. 5 depicts by example a current lead-through 18 with parts of the arrangement 1 according to the invention for current measurement. In a planar board 19 (e-pin board) implemented in kidney shape, three lead-through contacts 20 are located. Implementation of the planar board 19 is not limited to the kidney shape. Implementations in circular, elliptical, square, rectangular or polygonal form are also feasible. For the securement and electrical insulation of the three lead-through contacts 20 a casting compound 21 is placed between each lead-through contact 20 and the planar board 19 surrounding it in the proximity of the lead-through site. This casting compound 21 is shown by example in FIG. 5 on the central lead-through contact 20.

To measure the current flowing through a lead-through contact 20, on a coil former 28, for example several turns of a copper wire are wound and the measuring coil 28 is implemented in this manner. The inner diameter of the coil former 28 is preferably such that the coil former 28 can be slid onto a lead-through contact 20. The material utilizable for the coil former 28 can be, for example, synthetic material or Teflon.

The planar board 19 comprises, for example, a circumferential groove having the course depicted in FIG. 5, into which a sealing 22 can be placed. The compressor housing 24 of a refrigerant compressor 23 comprises an opening corresponding to the depicted planar board 19, which opening can be closed by the planar board 19. The planar board 19 includes openings in order to pass securement screws through it to bolt the planar board 19 onto the compressor housing 24. In the example of FIG. 5 two openings are depicted.

In this embodiment the wire windings of the measuring coil 26 do not make contact with the lead-through contacts 20 and are consequently galvanically separated from them. To fix mechanically the positions of the coil formers 28 of the measuring coils 26 after they have been slid onto the lead-through contacts 20, an adhesive or casting compound can be utilized, for example.

The connection wires of the measuring coils 26 are connected across corresponding lines, not shown in FIG. 5, to the associated differential amplifiers 12, 13 and 14 to generate the output signals V_1, V_2 and V_3 of the arrangement for current measurement. These output signals V_1, V_2 and V_3 are carried to a central control unit or an inverter including a control means and in this way enable the control of the speed as well as the torque of the drive motor 2.

FIG. 6 depicts a further embodiment of the e-pin board 19 with parts of the arrangement 1 according to the invention for current measurement. FIG. 6 shows only the right portion of the current lead-through 18 known from FIG. 5 with the planar board 19 and a lead-through contact 20.

On this lead-through contact 20 an annular magnetic support 29 is disposed which is encircled by the measuring coil 26 formed by several wire turns. This unit, comprised of measuring coil 26 and the annular magnetic support 29, is secured in the position shown in FIG. 6 for example by means of an adhesive or a casting compound, that are not shown, such that it is electrically insulated against the lead-through contact 20.

In this embodiment of the invention the connection wires of the measuring coils 26 are also connected across corresponding lines, not shown in FIG. 6, to the associated differential amplifiers 12, 13 and 14 to generate the output signals V_1, V_2 and V_3 of the arrangement for current measurement 1.

With the present invention advantages can be attained with respect to technical circuitry expenditures, space requirement of the current sensor electronics as well as costs.

Inherent in their functional principle, the galvanic isolation between measuring coil 26 and the lead-through contact 20 (e-pin) makes feasible omitting isolated amplifiers, Hall sensors or similar components. This decreases the technical circuitry expenditures, lowers the space requirement for the electronics on the board of the arrangement 1 for current measurement and hereby permits a reduction of costs.

As described previously, in particular when measuring high currents (>20 A) correspondingly large components are required in the installation space. By measuring the currents at the lead-through contacts 20 these large components can be omitted. The space requirement in the board layout as well as in the entire installation space can hereby also be lowered further.

LIST OF REFERENCE NUMBERS

1 Arrangement for current measurement
2 Drive motor
3 First phase winding
4 Second phase winding
5 Third phase winding
6 First motor phase current
7 Second motor phase current
8 Third motor phase current
9 First shunt resistor
10 Second shunt resistor
11 Third shunt resistor
12 First differential amplifier
13 Second differential amplifier
14 Third differential amplifier
15 First differential amplifier output
16 Second differential amplifier output
17 Third differential amplifier output
18 Current lead-through
19 Planar board (e-pin board)
20 Lead-through contact
21 Casting compound
22 Sealing
23 Refrigerant compressor
24 Compressor housing, end housing
25 Coolant, cooling solution
26 Measuring coil/winding
27 Circuit board
28 Coil former
29 Annular magnetic support

The invention claimed is:

1. An arrangement for current measurement at a current lead-through, comprising a planar board in which at least one lead-through contact is disposed, wherein between the planar board and the lead-through contact an electrically insulating casting compound is disposed, a sensor for generating a sensor signal and an amplifier configuration for the amplification of the generated sensor signal, wherein the sensor is a measuring coil and wherein the measuring coil is disposed on the lead-through contact such that the measuring coil is galvanically isolated therefrom.

2. An arrangement as in claim 1, wherein on the lead-through contact a coil former is disposed on the lead through contact on which several wire windings forming the measuring coil are applied.

3. An arrangement as in claim 1, wherein on the lead-through contact an annular magnetic support is disposed on the lead through contact around which several wire windings forming the measuring coil are disposed.

4. An arrangement according to as in claim 2, wherein coil former or the annular magnetic support is disposed tightly on the lead-through contact (20) using an adhesive or casting compound.

5. An arrangement according to claim 2, wherein the coil former of the measuring coil comprises a synthetic material or Teflon.

6. An arrangement according to claim 3, wherein the annular magnetic support (29) is comprised of comprises a ferrite or a ferrite alloy with a permeability greater than 300 H*m−1.

7. An arrangement according to claim 1, wherein in the planar board a circumferential groove is disposed into which a sealing is placed.

8. An arrangement according to claim 1, wherein the planar board is disposed on a compressor housing of a refrigerant compressor.

9. An arrangement according to claim 1, wherein in the planar board of the current lead-through two or three lead-through contacts are disposed and wherein on each of these lead-through contacts one measuring coil is disposed.

10. An arrangement according to claim 1, wherein a circuit board is disposed, wherein on this circuit board one or several differential amplifiers are disposed, wherein each of the differential amplifiers is connected at the input side to one measuring coil each, wherein the lead-through contacts are connected to the circuit board for the current supply for the drive motor, and wherein on the circuit board outputs of the arrangement for the current measurement are disposed, each of which is connected to the outputs of the differential amplifiers.

11. An arrangement according to claim 2, wherein the coil former of the measuring coil comprises Teflon.

12. An arrangement according to claim 3, wherein the coil former or the annular magnetic support is disposed tightly on the lead-through contact) using an adhesive or casting compound.

13. An arrangement according to claim 4, wherein the annular magnetic support comprises a ferrite or a ferrite alloy with a permeability greater than 300 H*m−1.

14. An arrangement according to claim 2, wherein in the planar board a circumferential groove is disposed into which a sealing is placed.

15. An arrangement according to claim 4, wherein in the planar board a circumferential groove is disposed into which a sealing is placed.

16. An arrangement according to claim 2, wherein the planar board is disposed on a compressor housing of a refrigerant compressor.

17. An arrangement according to claim 3, wherein the planar board is disposed on a compressor housing of a refrigerant compressor.

18. An arrangement according to claim 4, wherein the planar board is disposed on a compressor housing of a refrigerant compressor.

19. An arrangement according to claim 5, wherein the planar board is disposed on a compressor housing of a refrigerant compressor.

20. An arrangement according to claim 2, wherein in the planar board of the current lead-through two or three lead-through contacts are disposed and wherein on each of these lead-through contacts one measuring coil is disposed.

* * * * *